(12) United States Patent
Sugiyama et al.

(10) Patent No.: US 10,849,243 B2
(45) Date of Patent: Nov. 24, 2020

(54) DISPLAY APPARATUS

(71) Applicant: Panasonic Intellectual Property Management Co., Ltd., Osaka (JP)

(72) Inventors: Tomonori Sugiyama, Osaka (JP); Shusuke Okano, Osaka (JP); Takayuki Nagahara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/750,406

(22) Filed: Jan. 23, 2020

(65) Prior Publication Data

US 2020/0253071 A1 Aug. 6, 2020

(30) Foreign Application Priority Data

Feb. 1, 2019 (JP) .................................. 2019-017328
Nov. 20, 2019 (JP) .................................. 2019-209741

(51) Int. Cl.

| | |
|---|---|
| *H05K 5/02* | (2006.01) |
| *H05K 5/00* | (2006.01) |
| *G02F 1/01* | (2006.01) |
| *H05K 7/20* | (2006.01) |
| *G06F 3/044* | (2006.01) |

(52) U.S. Cl.
CPC ......... *H05K 5/0243* (2013.01); *G02F 1/0147* (2013.01); *H05K 5/0017* (2013.01); *H05K 7/20954* (2013.01); *G06F 3/044* (2013.01)

(58) Field of Classification Search
CPC .. G02F 1/0147; H05K 5/0243; H05K 5/0017; H05K 7/20954
See application file for complete search history.

(56) References Cited

U.S. PATENT DOCUMENTS

| | | | |
|---|---|---|---|
| 2006/0193042 A1* | 8/2006 | Karlsen .................. | G03B 21/62 359/443 |
| 2007/0285775 A1* | 12/2007 | Lesage .................. | G02F 1/0147 359/465 |
| 2012/0033288 A1* | 2/2012 | Lee ........................ | G02F 1/0147 359/288 |
| 2012/0322182 A1* | 12/2012 | Yang .................. | H01L 29/78633 438/29 |
| 2015/0138224 A1* | 5/2015 | Kim ........................ | G09G 3/38 345/592 |

(Continued)

FOREIGN PATENT DOCUMENTS

JP 2010-261978 11/2010

*Primary Examiner* — Michael Pervan
(74) *Attorney, Agent, or Firm* — Wenderoth, Lind & Ponack, L.L.P.

(57) ABSTRACT

A display apparatus of the present disclosure includes: a display unit disposed on a surface of a main body case and displaying information; a heat source layer laminated on the display unit; and a design layer laminated on the heat source layer, wherein the design layer contains a substance having light transmittance changing due to a temperature change and forms a light transmittance change region having light transmittance changing in accordance with a temperature change of the heat source layer, and a gradation region having light transmittance changing in a gradational manner along an outer periphery of the light transmittance change region.

14 Claims, 7 Drawing Sheets

(56) References Cited

U.S. PATENT DOCUMENTS

2015/0309312 A1* 10/2015 Alton .................... G06T 19/006
                                                        345/592
2016/0161770 A1*  6/2016 Joo ....................... G02F 1/0102
                                                        359/241

* cited by examiner

Fig. 13 ically a display area of a liquid crystal panel 102 can be visually recognized from the outside.

DISPLAY APPARATUS

TECHNICAL FIELD

The present disclosure relates to a display apparatus.

BACKGROUND OF THE INVENTION

Figure 12:
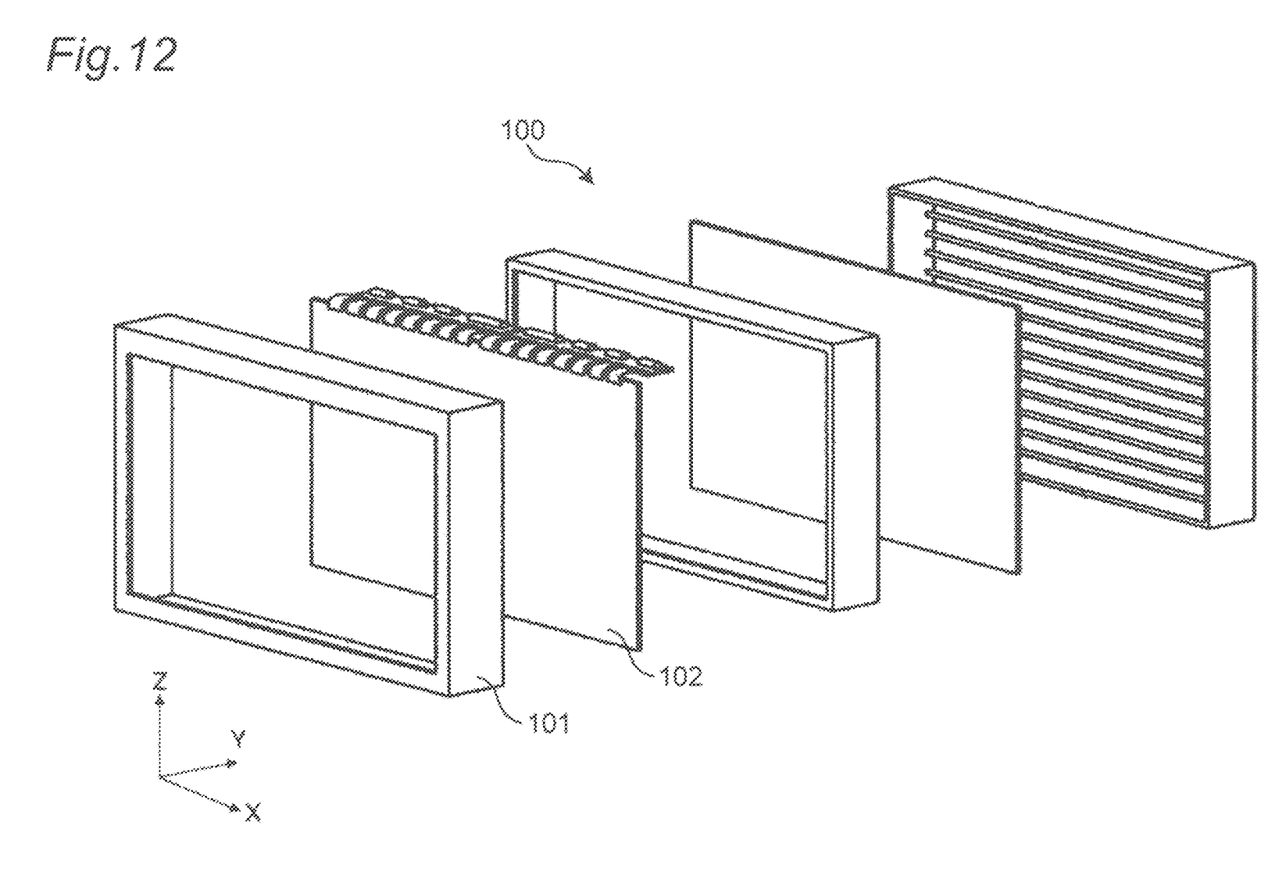
FIG. 12 is a diagram showing an information display apparatus of Japanese Laid-Open Patent Publication No. 2010-261978.

An information display apparatus 100 described in Japanese Laid-Open Patent Publication No. 2010-261978 is shown in FIG. 12. The information display apparatus 100 has a configuration in which a housing 101 constituting an outermost surface is provided with a rectangular hole having a size equal to or smaller than a display area of a liquid crystal panel 102 so that information displayed on the liquid crystal panel 102 can be visually recognized from the outside.

PATENT LITERATURE

Patent Document 1: Japanese Laid-Open Patent Publication No. 2010-261978

The information display apparatus of Japanese Laid-Open Patent Publication No. 2010-261978 still has room for improvement in terms of improvement in designability.

BRIEF DESCRIPTION OF THE INVENTION

A display apparatus of the present disclosure includes a display unit disposed on a surface of a main body case and displaying information, a heat source layer laminated on the display unit, and a design layer laminated on the heat source layer, and the design layer contains a substance having light transmittance changing due to a temperature change and forms a light transmittance change region having light transmittance changing in accordance with a temperature change of the heat source layer, and a gradation region having light transmittance changing in a gradational manner along an outer periphery of the light transmittance change region.

According to the present disclosure, a display apparatus improved in designability can be provided.

DESCRIPTION OF THE PREFERRED EMBODIMENTS (Background to the Present Disclosure)

Due to diversification of customers' preferences, a wide range of design expressions is required, and high designability is required.

However, in the information display apparatus 100 of Japanese Laid-Open Patent Publication No. 2010-261978, the housing 101 and the liquid crystal panel 102 are made up of different components, a boundary therebetween is easily recognized from the outside regardless of whether the liquid crystal panel 102 is lit. This causes a problem of reduced designability.

Figure 13:
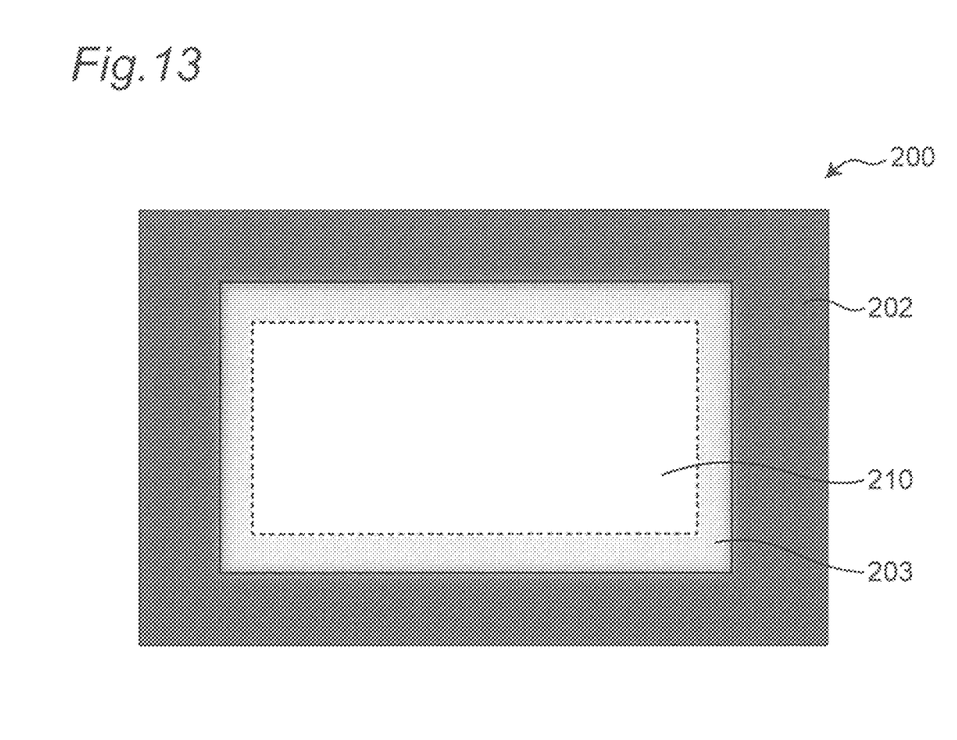
FIG. 13 is a diagram showing a conventional display apparatus.

A conventional information display apparatus 200 shown in FIG. 13 has an information display area 201 made of a transparent material and has a decoration part 202 colored in any color on an outer periphery thereof with a boundary part 203 between the information display area 201 and the decoration part 202. By applying a gradation to the boundary part 203 so that any color gradually becomes transparent, the boundary between the information display area 201 and the decoration part 202 is displayed in a gradational manner when information is displayed in the information display area 201. In this way, when information is displayed in the information display area 201 in the information display apparatus 200, the periphery thereof is represented in a gradational manner. However, when no information is displayed in the information display area 201, the presence of the information display area 201 is easily recognized due to a difference in design between the information display area 201 and the decoration part 202. This causes a problem of reduced designability.

A natural material such as natural wood is used in some information display apparatuses. However, a design using a natural material makes it difficult to represent a boundary between an information display part such as a liquid crystal panel and the natural material in a gradational manner, so that the boundary between the information display part and the natural material is easily recognized from the outside.

For example, these information display apparatuses may be mounted on vehicles as in-vehicle devices. Even if no information is displayed in the information display area, the presence thereof is easily recognized by a driver when the driver moves the line of sight, so that the driver may pay attention to the information display area. This may cause a delay in driver's safety confirmation.

Therefore, the present inventors have studied a display apparatus for solving these problems and devised the following configuration.

A display apparatus according to an aspect of the present disclosure includes a display unit disposed on a surface of a main body case and displaying information, a heat source layer laminated on the display unit, and a design layer laminated on the heat source layer, and the design layer contains a substance having light transmittance changing due to a temperature change and forms a light transmittance change region having light transmittance changing in accordance with a temperature change of the heat source layer, and a gradation region having light transmittance changing in a gradational manner along an outer periphery of the light transmittance change region.

Such a configuration can improve designability.

The substance having light transmittance changing due to a temperature change may contain a thermochromic material.

With such a configuration, whether the information is displayed or not can be selected by changing the light transmittance through a temperature change, so that the information of the display unit can be displayed on the display apparatus as needed.

The substance having light transmittance changing due to a temperature change may be contained in the design layer at a proportion greater than 5% and less than 80% of the volume of the design layer.

With such a configuration, the light transmittance can be changed in accordance with a temperature change without impairing the designability of the design layer.

The heat source layer may include a temperature change part generating a temperature change, and a temperature gradual change part disposed along an outer periphery of the temperature change part and gradually changed in temperature; in the light transmittance change region, the light transmittance may change in accordance with the temperature change of the temperature change part; and in the gradation region, the light transmittance may change in accordance with the temperature change of the temperature gradual change part.

With such a configuration, the light transmittance can be changed stepwise, so that the designability can be improved.

The heat source layer may include a plurality of temperature change parts and a plurality of temperature gradual change parts.

With such a configuration, multiple pieces of information can be displayed.

The display apparatus may further include a contact type or non-contact type temperature change controller controlling the plurality of temperature change parts.

With such a configuration, the information can be displayed at any positions.

The design layer may include a natural material layer containing at least one of natural materials that are wood, stone, cork, cloth, paper, and leather.

With such a configuration, the designability can further be improved.

A transmitted light adjustment layer is formed in a surface of the design layer facing the heat source layer, the transmitted light adjustment layer adjusts an amount or diffusion of light from the display unit.

With such a configuration, the amount or diffusion of light can be adjusted, and a favorable image quality of the information display part can be obtained.

The natural material layer may contain wood, and the natural material layer may be impregnated with an organic resin having a molecular weight of 100 or more to 50000 or less.

With such a configuration, new functionality can be imparted.

The natural material layer may contain wood, cork, or leather and may be decolored by removing a portion of components of the natural material layer.

With such a configuration, new functionality and appearance can be imparted.

The natural material layer may contain wood, and any material of color pigments, dyes, flame retardants, or fluorescent paints may be added to the inside or surface of the natural material layer.

With such a configuration, new functionality and appearance can be imparted.

The design layer may have a contact type operation controller, and the operation controller may control the display unit.

With such a configuration, the display unit can be controlled by inputting a signal from the outside.

The design layer may have a non-contact type operation controller, and the operation controller may control the display unit.

With such a configuration, the display unit can be controlled by inputting a signal from the outside.

The design layer may include a contact type first operation controller and a non-contact type second operation controller, and operation control for the display unit may be assigned to each of the first operation controller and the second operation controller.

With such a configuration, the display unit can be controlled by inputting a signal from the outside.

Embodiments will now be described with reference to the drawings.

First Embodiment

Figure 1:
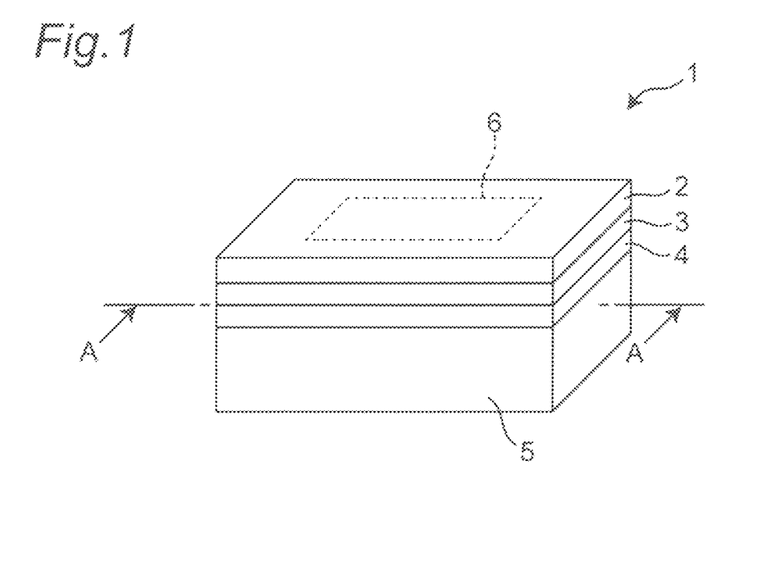
FIG. 1 is a diagram showing a basic configuration of a display apparatus according to a first embodiment.
Figure 2:
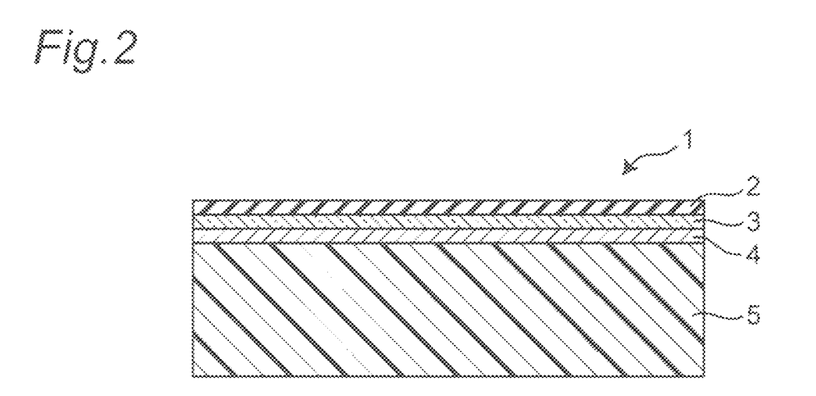
FIG. 2 is a cross-sectional view of the display apparatus of FIG. 1.
Figure 3:
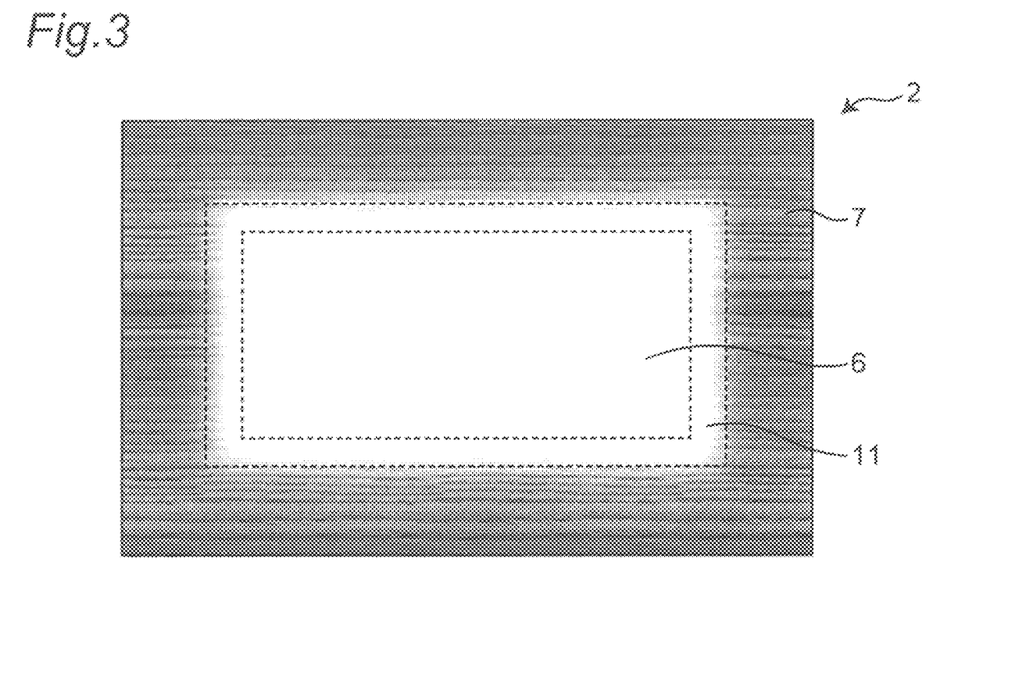
FIG. 3 is a diagram showing a design layer of the display apparatus of FIG. 1.
Figure 4:
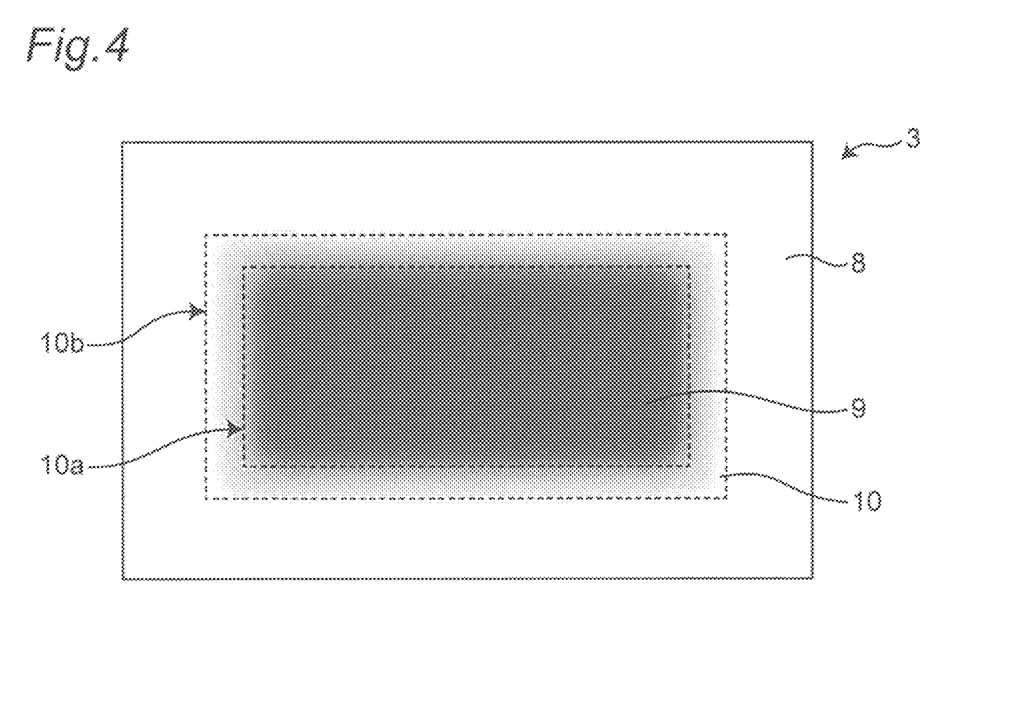
FIG. 4 is a view showing a heat source layer of the display apparatus of FIG. 1.

FIG. 1 is a diagram showing a basic configuration of a display apparatus 1 according to the present disclosure. FIG. 2 is a cross-sectional view on arrow taken along a line A-A in a direction from a design layer 2 to a main body case 5 of FIG. 1. FIG. 3 is a plan view of the design layer 2 of FIG. 2. FIG. 4 is a plan view of a heat source layer of FIG. 2.

As shown in FIGS. 1 and 2, the display apparatus 1 includes the design layer 2, a heat source layer 3, a display unit 4, and the main body case 5. The display unit 4, the heat source layer 3, and the design layer 2 are laminated in this order on the main body case 5. The design layer 2 and the heat source layer 3 are in close contact with each other or are bonded by an adhesive having favorable thermal conductivity, and an amount of heat generated in the heat source layer 3 is efficiently conducted to the design layer 2.

The design layer 2 contains a substance having light transmittance changing in accordance with an external temperature change. Materials usable as the substance having light transmittance changing in accordance with an external temperature change are thermochromic materials represented by metal inorganic materials such as bianthrones, spirooxazines, spiropyran, salicylideneanilines, or vanadium dioxide. The substance having light transmittance changing in accordance with an external temperature change can be mixed with water, a polymer resin such as polyethylene glycol, or a solvent such as an organic solvent and contained in the design layer 2 by a common technique such as coating or impregnation.

An information display part 6 is formed in the design layer 2. The information display part 6 displays information from the display unit 4 when light transmittance is changed in accordance with a temperature change of the heat source layer 3. For example, when the temperature rises due to the heat source layer 3, the information display part 6 displays information from the display unit 4. The information display part 6 is disposed so that the information displayed on the display unit 4 is displayed on the design layer 2 and visible from the outside.

The substance having light transmittance changing in accordance with an external temperature change is preferably contained in the design layer 2 at a proportion greater than 5% and less than 80% of the volume of the design layer 2. When the volume of the substance having light transmittance changing in accordance with an external temperature change is 5% or less of the volume of the design layer 2, a change in the light transmittance relative to a temperature change is small and makes it difficult to visibly display the information from the display unit 4. If the volume of the substance having light transmittance changing in accordance with an external temperature change is 80% or more of the volume of the design layer 2, the substance having light transmittance changing in accordance with an external temperature change may impair texture of material used for the design layer 2.

As shown in FIG. 3, the design layer 2 has an exterior design 7 that is decoration visually recognized from the outside on a front surface or a back surface. In this embodiment, a grain pattern is applied as the exterior design 7 to the design layer 2. The exterior design 7 is not limited to the grain pattern, and various designs can be employed.

In the design layer 2, a decorative gradation part 11 having light transmittance changing in a gradational manner is formed along an outer periphery of the information display part. The decorative gradation part 11 has the light transmittance changing in a gradational manner in accordance with a temperature change of the heat source layer 3.

The information display part 6 corresponds to a "light transmittance change region" in claim 1 of the present disclosure, and the decorative gradation part 11 corresponds to a "gradation region" in claim 1 of the present disclosure.

As shown in FIG. 4, the heat source layer 3 includes an outer peripheral part 8, a temperature change part 9, and a temperature gradual change part 10. The temperature change part 9 generates heat to cause a temperature change. The temperature change part 9 can be formed by disposing a transparent heater in the heat source layer 3, for example. Alternatively, the temperature change part 9 can be formed by heating with near infrared rays or far infrared rays. To efficiently conduct heat, a layer with an optimal high thermal conductivity or a heat-retaining function may be disposed on a back surface of the design layer 2.

The outer peripheral part 8 is disposed around the temperature change part 9. The outer peripheral part 8 is made of a material hardly conducting the heat of the temperature change part 9.

The temperature gradual change part 10 is disposed between the temperature change part 9 and the outer peripheral part 8. Specifically, the temperature gradual change part 10 is disposed along the outer periphery of the temperature change part 9. The temperature gradual change part 10 is made up of a member with thermal conductivity changing from the temperature change part 9 toward the outer peripheral part 8.

The temperature gradual change part 10 is changed in temperature due to conduction of the heat generated in the temperature change part 9. Specifically, the temperature gradual change part 10 generates a temperature change such that the temperature gradually increases or decreases on the side close to the temperature change part 9 due to the heat generated in the temperature change part 9. Therefore, the temperature gradual change part 10 generates a temperature change such that the temperature increases or decreases stepwise or continuously from an inner peripheral end portion 10a to an outer peripheral end portion 10b of the temperature gradual change part 10. By generating a temperature change such that the temperature near the inner peripheral end portion 10a of the temperature gradual change part 10 is close to the temperature of the temperature change part 9 while the temperature near the outer peripheral end portion 10b is close to the temperature of the outer peripheral part 8, a gradational temperature distribution is achieved from the temperature change part 9 to the outer peripheral part 8. Since the temperature gradual change part 10 is disposed, the decorative gradation part 11 having light transmittance gradually reduced outward from the information display part 6 is formed in the design layer 2 while the temperature change is generated in the temperature change part 9.

When the temperature is not changed in the heat source layer 3, the light transmittance of the design layer 2 is 0%, so that the information displayed on the display unit 4 is blocked by the exterior design 7 of the design layer 2 and is not visually recognized from the outside, and only the exterior design 7 applied to the design layer 2 is visually recognized. On the other hand, for example, when heat is generated in the heat source layer 3 to cause a temperature change, the generated heat is conducted to the design layer 2, and the light transmittance becomes higher in a region of the design layer 2 overlapping with a region of the heat source layer 3 in which the temperature change is generated. Therefore, the information displayed on the display unit 4 is transmitted through the design layer 2 so that the information can visually be recognized from the outside. In other words, when heat is generated in the heat source layer 3, the light transmittance becomes higher in a portion of the design layer 2, and the information displayed on the display unit 4 is displayed on the information display part 6.

The heat of the heat source layer 3 can be adjusted to arbitrarily select whether to display the exterior design 7 or display information on the information display part 6 by the display unit 4 when viewed from the outside.

For the display unit 4, for example, an LED light pattern, 1seg, liquid crystal, or OLED can be employed. The main body case 5 is made of resin, for example, and is a case housing the design layer 2, the heat source layer 3, and the display unit 4.

Figure 5:
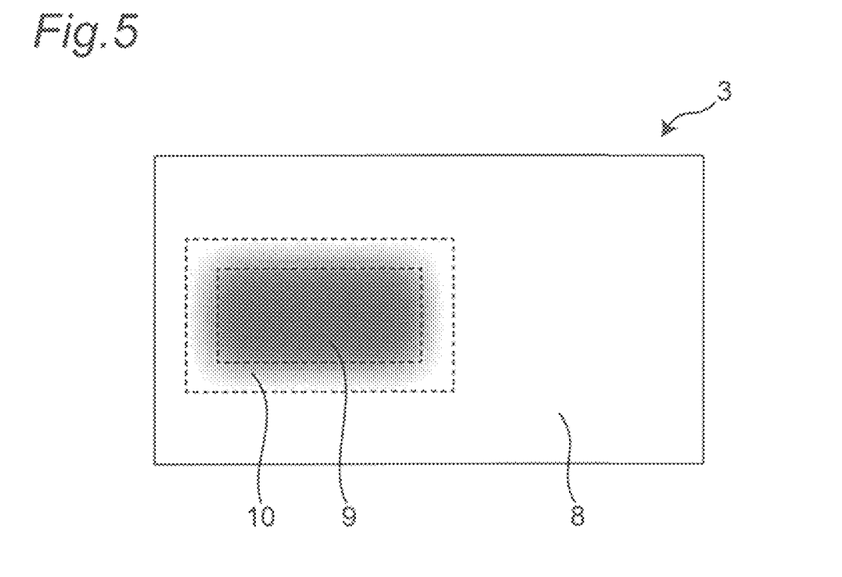
FIG. 5 is a diagram showing a modification of the display apparatus of FIG. 1.
Figure 6:
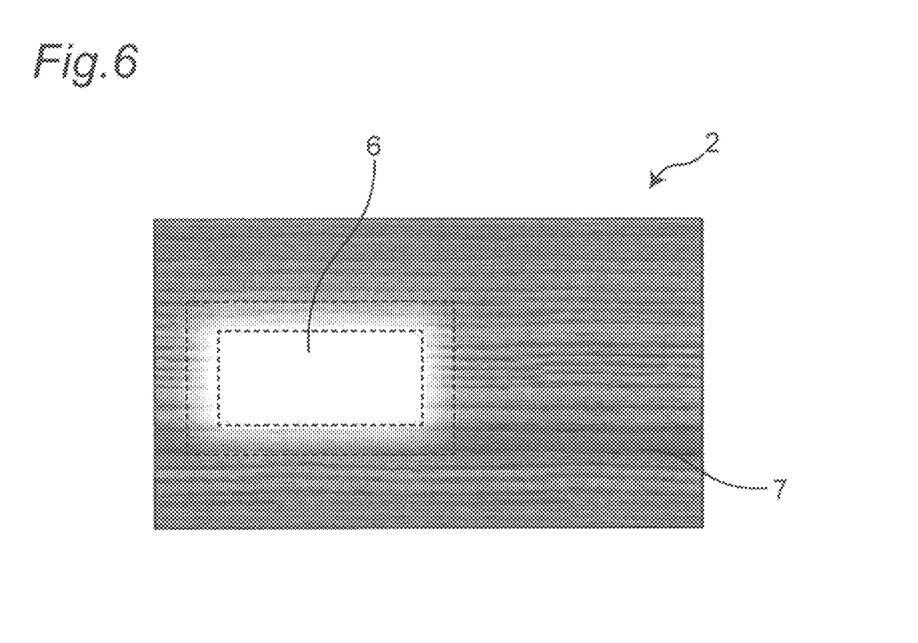
FIG. 6 is a diagram showing a modification of the display apparatus of FIG. 1.

The positions and sizes of the temperature change part 9 and the temperature gradual change part 10 can arbitrarily be changed. For example, as shown in FIG. 5, the small temperature change part 9 may be arranged close to an end of the heat source layer 3. In this case, as shown in FIG. 6, the size of the information display part 6 formed in the design layer 2 becomes smaller as compared to the size of the design layer 2, and the design of the grain pattern can be made more conspicuous.

According to the display apparatus 1 of the present disclosure, when information is displayed on the information display part 6, a gradational representation is given between the information display part 6 and the surrounding exterior design to improve an integrated feeling of the information display part 6 and the exterior design 7 so that high designability can be achieved. When no information is displayed on the information display part 6, the information display part 6 can be hidden by the design layer 2.

(Modification)

Figure 7:
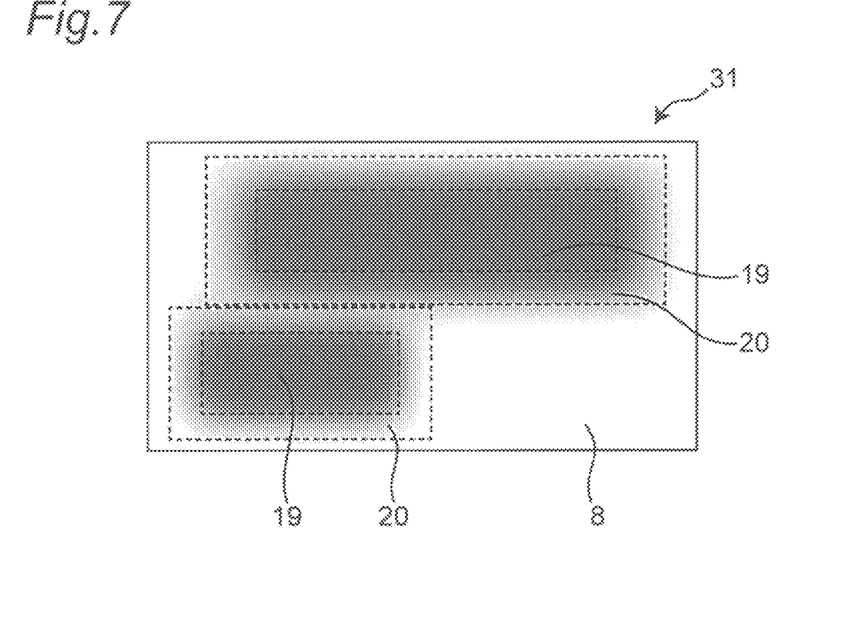
FIG. 7 is a diagram showing a heat source layer of a display apparatus according to a second embodiment.
Figure 8:
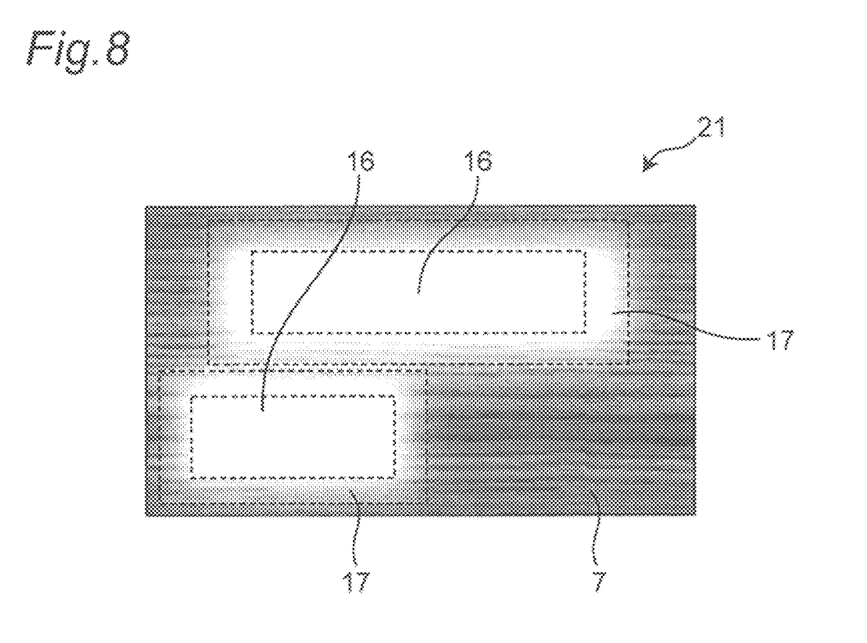
FIG. 8 is a diagram showing a design layer of the display apparatus according to the second embodiment.

FIGS. 7 and 8 show a modification of this embodiment. A heat source layer 31 has two temperature change parts 19 and two temperature gradual change parts 20. Therefore, two information display parts 16 and two decorative gradation parts 17 are formed in a design layer 21. The shapes, sizes, positions, and numbers of the temperature change parts 19 and the temperature gradual change parts 20 may arbitrary be set. By disposing the temperature gradual change parts 20 on the outer peripheries of the temperature change parts 19, the decorative gradation parts 17 are formed on the outer peripheries of the information display parts 16 in the design layer 21.

In this case, a temperature change controller can be disposed to individually heat each of the temperature change parts 19. As a result, the information display parts 16 are formed at positions coordinated with distribution of the heated temperature change parts 19 in the design layer 21, and the information display parts 16 are hidden to display the exterior design 7 at positions coordinated with the unheated temperature change parts 19 in the design layer 21.

For the temperature change controller, a contact type or non-contact type apparatus, for example, a transparent film heater or a near infrared sheet can be employed. The temperature change controller controls the temperature change parts 19 to cause individual changes in temperature. By coordinating the distribution of the information display parts 16 with a layout of information displayed on the display unit 4, multiple pieces of information can be displayed at any positions. In this way, only necessary information can be displayed at a necessary position, which can be represented in combination with the gradation effect on the outer peripheries of the information display parts 16 to provide a higher-class feeling. Furthermore, safety can be improved.

Second Embodiment

A display apparatus according to a second embodiment of the present disclosure will be described. In the second embodiment, differences from the first embodiment will mainly be described. In the second embodiment, the same or equivalent constituent elements as those in the first embodiment will be described with the same reference numerals. In the second embodiment, the same description as the first embodiment will not be made.

Figure 9:
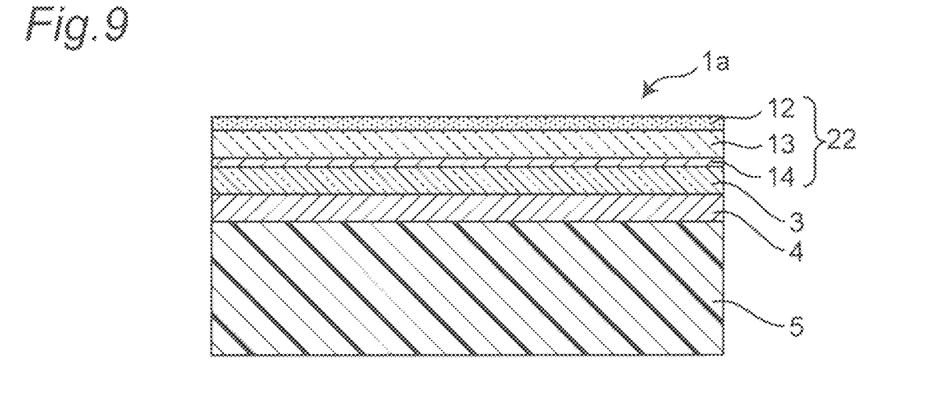
FIG. 9 is a cross-sectional view of a display apparatus according to a third embodiment.

FIG. 9 is a cross-sectional view of a display apparatus 1a of the present disclosure.

The display apparatus 1a of the second embodiment is different from the first embodiment in that a design layer 22 has a natural material sheet 12 and a transmitted light adjustment layer 14.

As shown in FIG. 9, in this embodiment, the design layer 22 includes the natural material sheet 12, a transparent base layer 13, and the transmitted light adjustment layer 14.

The design layer 22 is formed by disposing the natural material sheet 12 on an upper surface of the transparent base layer 13 made of resin or glass.

The natural material sheet 12 is made of a material containing any one or more of natural materials that are wood, stone, cork, cloth, paper (Japanese paper), and leather. When the temperature is not changed in the heat source layer 3, the color and appearance derived from the natural materials can visually be recognized. In this embodiment, the natural material sheet corresponds to a "natural material layer" of the present disclosure.

The transparent base layer 13 is a layer for transmitting light from the display unit 4 to form an information display part on the natural material sheet 12.

The transmitted light adjustment layer 14 is disposed on a surface of the design layer 22 facing the heat source layer 3 and adjusts light transmittance or light diffuseness. In other words, the transmitted light adjustment layer 14 adjusts an amount or diffusion of light from the display unit 4.

The natural material sheet 12 may be disposed on a lower surface of the transparent base layer 13. The transmitted light adjustment layer 14 may be disposed on a lower surface of the natural material sheet 12. The transmitted light adjustment layer 14 may not be disposed.

The natural material may be impregnated with an organic resin having a molecular weight of 100 or more to 50,000 or less. For example, when the natural material sheet 12 contains wood, the natural material sheet 12 may be impregnated with an organic resin having a molecular weight of 100 or more to 50,000 or less. For example, when the natural material sheet 12 contains wood, cork, or leather and is a material difficult to impregnate, the natural material sheet 12 may be decolored by removing a portion of components thereof. The impregnation with an organic resin can be achieved by decoration with a coloring pigment or a dye after the decolorization treatment. For example, when the natural material sheet 12 contains wood, a coloring pigment, a dye, a flame retardant, a fluorescent paint, etc. may be added to the inside or the surface of the natural material sheet 12.

According to the display apparatus 1a of the present disclosure, an appearance derived from a natural material can be applied. By impregnating the natural material sheet 12 with an organic resin, the natural material sheet 12 can be increased in light transmittance, or a water-repellent or hydrophilic property can be imparted to the natural material sheet 12. A color pigment, a dye, a flame retardant, a fluorescent paint, etc., can be added to improve flame retardancy, to apply a new appearance not provided by natural materials such as fluorescent colors and primary colors, or to make unevenness, color, patterns, etc. closer to natural materials. In this way, a new function can be given. When the transmitted light adjustment layer 14 is disposed, an amount and diffusion of light from the display unit 4 can be adjusted to adjust the luminance and uniformity of the light emitted from the information display part 6, so that favorable appearance and image quality can be obtained.

Third Embodiment

A display apparatus according to a third embodiment of the present disclosure will be described. In the third embodiment, differences from the second embodiment will mainly be described. In the third embodiment, the same or equivalent constituent elements as those in the second embodiment will be described with the same reference numerals. In the third embodiment, the same description as the second embodiment will not be made.

Figure 10:
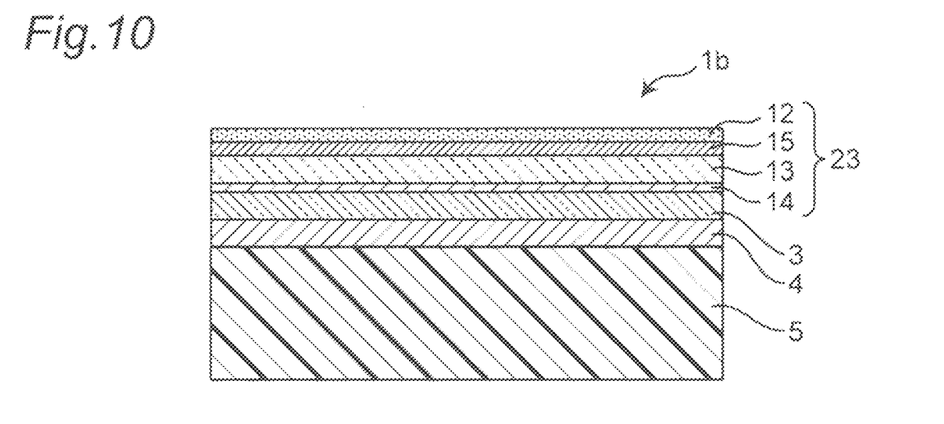
FIG. 10 is a cross-sectional view of a display apparatus according to a fourth embodiment.

FIG. 10 is a cross-sectional view of a display apparatus 1b of the present disclosure.

The display apparatus 1b of the third embodiment is different from the second embodiment in that an operation controller 15 is included in a design layer 23.

As shown in FIG. 10, the design layer 23 is provided with the operation controller 15 of a contact type using an electrostatic capacity etc. or a non-contact type using a distance image sensor etc. In this embodiment, the operation controller 15 is disposed between the natural material sheet 12 and the transparent base layer 13 of the design layer 23. The operation controller 15 enables a user to control the display unit 4 to input a signal from the outside.

Figure 11:
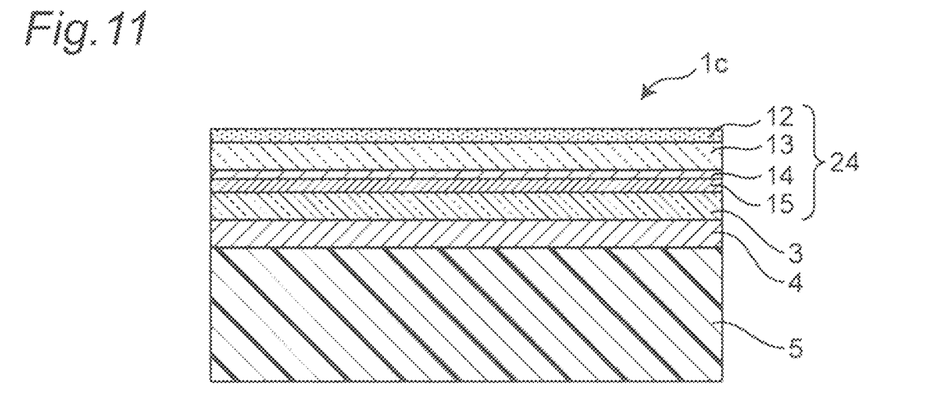
FIG. 11 is a cross-sectional view of the display apparatus according to the fourth embodiment.

As in a display apparatus 1c shown in FIG. 11, the operation controller 15 may be disposed on a surface of the transmitted light adjustment layer 14 of the design layer 24 on the side of the heat-source layer 3.

The display apparatus 1b, 1c can include both a contact type operation controller (corresponding to a "first operation controller" of the present disclosure) and a non-contact type operation controller (corresponding to a "second operation controller" of the present disclosure). Operation control for the display unit 4 can be assigned to each of the contact type operation controller and the non-contact type operation controller to provide the control in accordance with details of usage by the user.

According to the display apparatus 1b, 1c of the present disclosure, since the operation controller 15 is disposed, for example, volume control such as "brightness adjustment" and "sound volume adjustment" can be performed by directly touching a surface of the information display part. Therefore, the display control part 4 can be controlled with the operation controller 15. Additionally, depending on an intended use, the information display part can arbitrarily be moved, enlarged/reduced, increased/decreased in number, etc., with the touch of a user's finger, or the size and position of the temperature change part of the heat source layer 3 can be controlled to change the size and position of the information display part.

In the embodiments described above, regarding the change in the light transmittance of the design layer 2, small light transmittance becomes higher as the temperature changes from low to high; however, small light transmittance may become higher as the temperature changes from high to low. Even with such a configuration, the effects of the display apparatus described above can be produced.

The present disclosure contributes to high-class designs of exteriors of various household appliances, in-vehicle interiors, etc.

EXPLANATIONS OF LETTERS OR NUMERALS 1, 1a to 1c display apparatus
2, 21 to 24 design layer
3, 31 heat source layer
4 display unit
5 main body case
6, 16 information display part
8 outer peripheral part
9, 19 temperature change part
10, 20 temperature gradual change part
11, 17 decorative gradation part
12 natural material sheet (natural material layer)
14 transmitted light adjustment layer
15 operation controller

The invention claimed is:

1. A display apparatus comprising:
a display unit disposed on a surface of a main body case and displaying information;
a heat source layer laminated on the display unit; and
a design layer laminated on the heat source layer, wherein the design layer contains a substance having light transmittance changing due to a temperature change and forms a light transmittance change region having light transmittance changing in accordance with a temperature change of the heat source layer, and a gradation region having light transmittance changing in a gradational manner along an outer periphery of the light transmittance change region.

2. The display apparatus according to claim 1, wherein the substance having light transmittance changing due to a temperature change contains a thermochromic material.

3. The display apparatus according to claim 1, wherein the substance having light transmittance changing due to a temperature change is contained in the design layer at a proportion greater than 5% and less than 80% of the volume of the design layer.

4. The display apparatus according to claim 1, wherein the heat source layer includes
a temperature change part generating a temperature change, and
a temperature gradual change part disposed along an outer periphery of the temperature change part and gradually changed in temperature, wherein
in the light transmittance change region, the light transmittance changes in accordance with the temperature change of the temperature change part, and wherein
in the gradation region, the light transmittance changes in accordance with the temperature change of the temperature gradual change part.

5. The display apparatus according to claim 4, wherein the heat source layer includes a plurality of temperature change parts and a plurality of temperature gradual change parts.

6. The display apparatus according to claim 5, further comprising
a contact type or non-contact type temperature change controller controlling the plurality of temperature change parts.

7. The display apparatus according to claim 1, wherein
a transmitted light adjustment layer is formed in a surface of the design layer facing the heat source layer,
the transmitted light adjustment layer adjusts an amount or diffusion of light from the display unit.

8. The display apparatus according to claim 1, wherein the design layer includes a natural material layer containing at least one of natural materials that are wood, stone, cork, cloth, paper, and leather.

9. The display apparatus according to claim 8, wherein the natural material layer contains wood, and wherein the natural material layer is impregnated with an organic resin having a molecular weight of 100 or more to 50000 or less.

10. The display apparatus according to claim 8, wherein the natural material layer contains wood, cork, or leather and is decolored by removing a portion of components of the natural material layer.

11. The display apparatus according to claim 8, wherein the natural material layer contains wood, and wherein any material of color pigments, dyes, flame retardants, or fluorescent paints is added to the inside or surface of the natural material layer.

12. The display apparatus according to claim 1, wherein the design layer has a contact type operation controller, and wherein
the operation controller controls the display unit.

13. The display apparatus according to claim 1, wherein the design layer has a non-contact type operation controller, and wherein
the operation controller controls the display unit.

14. The display apparatus according to claim 1, wherein the design layer includes a contact type first operation controller and a non-contact type second operation controller, and wherein
operation control for the display unit is assigned to each of the first operation controller and the second operation controller.

* * * * *